United States Patent [19]

Honma

[11] Patent Number: 5,250,828
[45] Date of Patent: Oct. 5, 1993

[54] STRUCTURE OF SEMICONDUCTOR MEMORY DEVICE

[75] Inventor: Toshihiro Honma, Tokyo, Japan

[73] Assignee: Oki Electric Industry Co., Ltd., Tokyo, Japan

[21] Appl. No.: 863,039

[22] Filed: Apr. 3, 1992

[30] Foreign Application Priority Data

Apr. 3, 1991 [JP] Japan .................................. 3-071059

[51] Int. Cl.⁵ .............................................. H01L 27/10
[52] U.S. Cl. ................................. 257/296; 257/306; 257/308; 257/310; 257/379
[58] Field of Search ............... 357/23.7; 257/296, 306, 257/308, 310, 379

[56] References Cited

U.S. PATENT DOCUMENTS 5,057,888 10/1991 Fazan et al. .................... 357/23.7
5,072,276 12/1991 Malhi et al. .................... 357/23.7

FOREIGN PATENT DOCUMENTS 3-25972 2/1991 Japan .

*Primary Examiner*—Edward Wojciechowicz
*Attorney, Agent, or Firm*—Wenderoth, Lind & Ponack

[57] ABSTRACT

A semiconductor memory device has a stacked capacitor cell structure which is composed of two MIS transistors and one capacitor. One MIS transistor is formed between a charge accumulation electrode (storage node), and a substrate and an opposite conductive type diffusion layer region. This arrangement can reduce the charge flowing out of and into the substrate and the opposite conductive type diffusion layer region, thus improving the charge holding time.

10 Claims, 2 Drawing Sheets

STRUCTURE OF SEMICONDUCTOR MEMORY DEVICE

BACKGROUND OF THE INVENTION

(1) Field of the Invention

The present invention relates to the structure of a memory cell in a dynamic random access memory (DRAM), and in particular to a stacked capacitor cell structure thereof.

(2) Description of the Related Art

FIG. 4 shows the structure of a stacked capacitor cell. In the figure, there are shown an element isolation region 1 formed by a selective oxidation process, a gate oxide film 2 formed by thermal oxidation, a polycrystalline silicon gate electrode 3 for a memory transistor formed by a chemical vapor deposition process, impurity diffusion layers 4, 4' formed by ion implantation and having a conductive type opposite to that of a silicon substrate 10, a layer insulation film 5 formed by a CVD process, a contact hole 6 formed by etching, a conductive polycrystalline silicon layer 7, a capacitor insulation film 8, and a conductive polycrystalline silicon layer 9. With this arrangement, a memory cell comprising one transistor and one capacitor is formed, as shown by an equivalent circuit in FIG. 3. However, the above-mentioned memory cell structure suffers a decrease in accumulated charge capacity since the capacitance of the capacitor decreases as the level of integration of the device becomes higher thus making the area of the cell extremely small. Accordingly, a problem arises in that the so-called hold time, that is, the time of holding the accumulated charge becomes shortened.

SUMMARY OF THE INVENTION

An object of the present invention is to eliminate the problem in which the accumulated charge hold-time of a memory cell becomes short due to a decrease in the accumulated charge capacity.

The structure of a semiconductor memory device according to the present invention includes a MIS transistor formed between a charge accumulation electrode, and a substrate and opposite conductive type diffusion layer regions, thereby increasing the hold-time of accumulated charges.

According to the present invention, since the MIS transistor is provided, in a stacked capacitor cell, between the charge accumulation electrode, and the reverse conductive type diffusion layer domains and the substrate of a transfer gate for controlling the flow-in and -out of accumulated charges, the flow-out of the charges from the above-mentioned diffusion layer domains, that is, leak current can be reduced. Thus, it is possible to eliminate the above-mentioned problem.

DESCRIPTION OF THE PREFERRED EMBODIMENT

With reference to FIGS. 1(a) to 1(d) an explanation will be made of a process of manufacturing a semiconductor memory device structure according to the present invention.

Figure 1A:
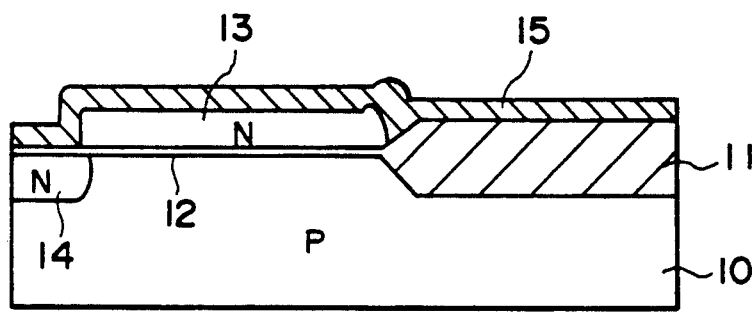
FIGS. 1(a) to 1(d) are sectional views showing a manufacturing process in one embodiment of the present invention.

First, an element isolation region 11 is selectively formed on a P-type silicon substrate 10 by a known LOCOS process. A gate oxide film 12 is selectively formed on the substrate by thermal oxidation in an atmosphere of $N_2:O_2:H_2 = 1:1:2$ at a temperature of 850 deg. C. for about ten minutes. A gate electrode (a first conductive polycrystalline silicon layer) 13 is formed on the gate oxide film 12 by a CVD process at a temperature of 620 deg. C. and at a pressure of about 0.2 torr. Thereafter, an N-type diffusion layer 14 is formed in the substrate 10 by ion implantation in which $As^+$ ions are implanted under the condition of $5 \times 10^{15}$ ions/cm$^2$ at 40 keV. Further, an insulation film 15 is formed on the structure obtained above by a CVD process at a temperature of 350 deg. C. and at a normal pressure (FIG. 1a).

Figure 1B:
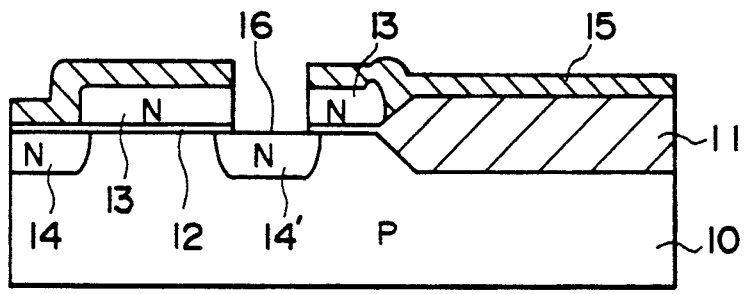

Next, the insulation film 15, the gate electrode 13 and the gate oxide film 12 are selectively removed by a well-known photolithography process or etching process to form a contact hole 16. Further, N-type impurities such as $As^+$ ions are implanted through the contact hole 16 into the exposed surface of the substrate 10 under the condition of $5 \times 10^{15}$ ions/cm$^2$ at 40 keV so that an N-type diffusion layer 14' is formed in the substrate 10 (FIG. 1b).

Then, the exposed polycrystalline silicon of the gate electrode 13 which is located at the side wall of the contact hole 16 is thermally oxidized under an atmosphere of $N_2:O_2:H_2 = 1:1:2$ at a temperature of 850 deg. C. for about ten minutes so that a gate insulation film 110 for a MIS transistor mentioned below is formed. The gate insulation film 110 may be formed of $Ta_2O_5$ film, a silicon nitride film, PZT film or the like which are formed by a CVD process or a sputter process. When the gate insulation film 110 is formed, an insulation film is also formed in the bottom part of the contact hole 16. The insulation film formed in the bottom of the contact hole 16 is selectively removed by anisotropic etching or the like. Accordingly, the gate insulation film 110 remains at only the side wall part of the contact hole 16.

Figure 1C:
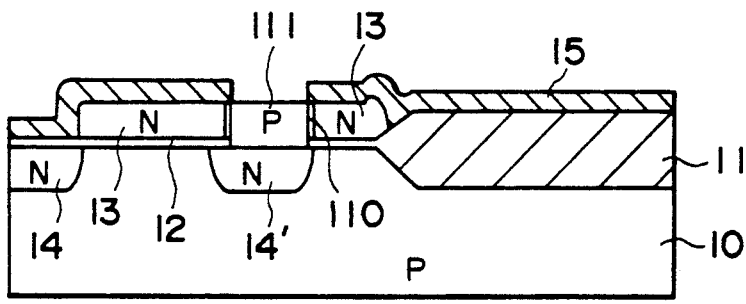

Thereafter, the contact hole 16 is filled up with polycrystalline silicon containing P-type impurity at a low density to form a silicon layer 111. This silicon layer 111 is obtained by the following steps. At the first step, polycrystalline silicon containing P-type impurity at a low density, is deposited on the entire surface of the structure shown in FIG. 1b up to a thickness of about 1 µm by a CVD process or the like. In this step, the surface of the deposited polycrystalline silicon is made to be flat. In the second step, the entire surface of the deposited polycrystalline silicon is then etched back to obtain the silicon layer 111 (FIG. 1c). The silicon layer 111 may be also formed in such a way that polycrystalline silicon containing P-type impurity at a low density is grown up on the substrate 10 by an epitaxial growth process in an atmosphere of 100% $SiH_4$ at 2 torr at a temperature of about 900 deg. C. for more than 30 minutes. Further, the silicon layer 111 may be replaced by a monocrystalline silicon layer. The monocrystalline silicon layer is formed as follows: Polycrystalline silicon containing P-type impurity is filled in the contact hole 16. Then, polycrystalline silicon is converted into monocrystalline silicon by laser-annealing in which Ar laser having a power of 15 W is applied at a substrate temperature of 400 deg. C. and at a speed of 50 cm/sec.

Then, a conductive polycrystalline silicon layer is formed on the entire surface of the structure obtained in the above step by a CVD process or the like so that it is electrically connected to the silicon layer 111. Further, the above polycrystalline silicon layer is subjected to patterning so as to form a charge accumulation electrode 17. When the polycrystalline silicon layer is formed by a low pressure CVD process at a temperature of about 570 deg. C. the resultant polycrystalline silicon layer has many microneous concavities and convexities on its outer surface. If there are many microneous concavities and convexities on the outer surface of the polycrystalline silicon layer, an outer surface of the polycrystalline silicon layer becomes larger, so that accumulated charge capacity thereof increases.

In this step, the MIS transistor is obtained. The MIS transistor is composed of the electrode 17 and diffusion layer 14' as a source/drain, the gate insulation film 110 and the gate electrode 13.

Then, a capacitor insulation film 18 is formed on the charge accumulation electrode 17. This capacitor insulation film 18 is formed of a thin film having a high dielectric constant, such as a silicon oxide film, a silicon nitride film or the like.

Figure 1D:
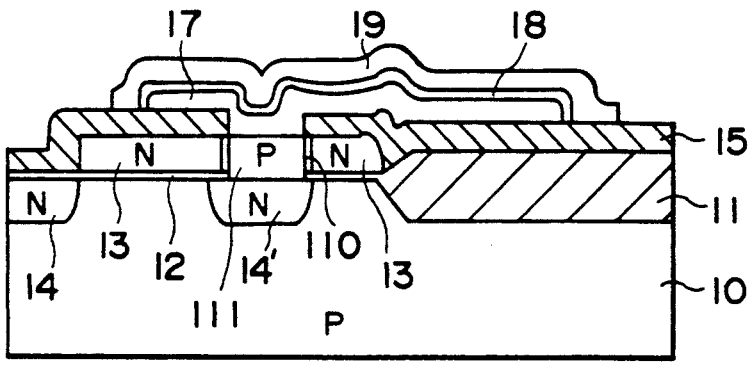

Next, a third polycrystalline silicon layer 19 is formed on the capacitor insulation film 18. This third silicon layer 19 is connected to the ground potential or a stationary potential (FIG. 1d).

Thus, the structure of the stacked capacitor cell has been completed.

Figure 2:
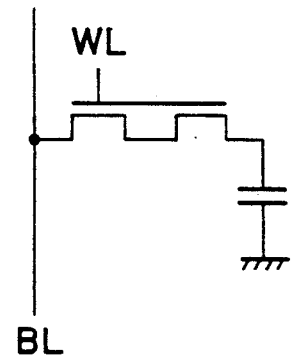
FIG. 2 is an equivalent circuit diagram showing the structure of a semiconductor memory device according to the present invention.
Figure 3:
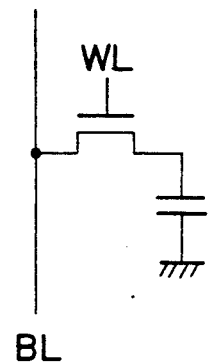
FIG. 3 is an equivalent circuit diagram showing the structure of a conventional semiconductor memory device.
Figure 4:
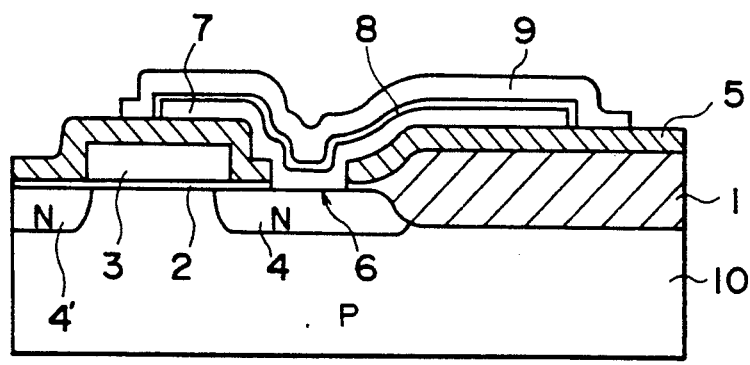
FIG. 4 is a sectional view showing the structure of a conventional semiconductor memory device.

FIG. 3 is an equivalent circuit diagram which shows a conventional capacitor cell. In this figure, it is found that only one transistor for connecting a memory capacitor with a bit line (BL) is present. FIG. 2 is an equivalent circuit diagram which shows a capacitor cell according to the present invention. As understood from this figure, two transistors are substantially present for connecting between the capacitor and the bit line (BL). Thus, it is found that charge accumulated in the capacitor can hardly leak in comparison with the conventional one.

What is claimed is:

1. A dynamic random access memory (DRAM) having a stack capacitor cell structure including a lateral transistor, a vertical transistor and a capacitor, said structure comprising:
    a first conductive type semiconductor substrate having a principal surface;
    a first and a second diffusion regions having a second conductive type formed on the principal surface of said first conductive type semiconductor substrate;
    a first thin insulation film formed on the principal surface of the semiconductor substrate and located between the first and second diffusion regions;
    a gate electrode formed on the first thin insulating layer, said gate electrode having a side surface which is substantially perpendicular to the principal surface of said semiconductor substrate;
    a second thin insulation film formed on the side surface of said gate electrode;
    a semiconductor layer having the first conductive type formed on said second diffusion region and said second this insulation film;
    a charge accumulation semiconductor electrode having the second conductive type formed on said semiconductor layer;
    a third thin insulation film formed on said semiconductor electrode; and
    an upper electrode formed on said third thin insulation film;
    wherein said first and second diffusion regions, said first thin insulation film and said gate electrode serve as the lateral transistor;
    said second diffusion region, said second thin insulation film, said semiconductor layer, said gate electrode and said semiconductor electrode serve as the vertical transistor; and
    said semiconductor electrode, said third thin insulation layer and said upper electrode serve as the capacitor.

2. A dynamic random access memory as set forth in claim 1, wherein said second thin insulation film is a silicon oxide film ($SiO_2$) ) which is grown thermally.

3. A dynamic random access memory as set forth in claim 1, wherein said second thin insulation film is a $Ta_2O_5$ film.

4. A dynamic random access memory as set forth in claim 1, wherein said second thin insulation film is a silicon nitride ($Si_3N_4$).

5. A dynamic random access memory as set forth in claim 1, wherein said second thin insulation film is a PZT film.

6. A dynamic random access memory as set forth in claim 1, wherein said semiconductor layer is formed of a polycrystalline silicon.

7. A dynamic random access memory as set forth in claim 1, wherein said semiconductor layer is formed of a monocrystalline silicon which is formed by an epitaxial growth.

8. A dynamic random access memory as set forth in claim 1, wherein said semiconductor layer is formed of a silicon which is monocrystallized by laser annealing.

9. A dynamic random access memory (DRAM) having a plurality of memory cells each of which has a lateral transistor, a vertical transistor electrically and serially connected to the lateral transistor and a capacitor electrically connected to the vertical transistor, each of the memory cells comprising:
    a semiconductor substrate having a first conductive type, the semiconductor substrate having a channel region of the lateral transistor formed on a principal surface thereof;
    a first and a second diffusion regions having a second conductive type formed on the principal surface of said semiconductor substrate, the first diffusion region serving as a first electrode of the lateral transistor, the second diffusion region serving as a second electrode of the lateral transistor and a first electrode of the vertical transistor;
    a first thin insulation film formed on the channel region of the lateral transistor, the first insulation film serving as a gate insulation film of the lateral transistor;
    a common gate electrode formed on the first thin insulating layer, said gate electrode having a side surface which is substantially perpendicular to the principal surface of said semiconductor substrate;
    a second thin insulation film formed on the side surface of said gate electrode, the second thin insulation film serving as a gate insulation film of the vertical transistor;

a first semiconductor layer having the first conductive type formed on said second diffusion region and said second thin insulation film, the first semiconductor layer serving as a channel of the vertical transistor;

a second semiconductor layer having the second conductive type formed on said first semiconductor layer, said second semiconductor layer serving as a second electrode of the vertical transistor and a lower electrode of the capacitor;

a third thin insulation film formed on said second semiconductor layer, the third thin insulation film serving as a dielectric layer of the capacitor; and a conductive layer formed on said third thin insulation film, the conductive layer serving as an upper electrode of the capacitor.

10. A memory cell having a lateral transistor, a capacitor and an electrical connector between the lateral transistor and capacitor, the memory cell comprising:

a semiconductor substrate of a first conductive type having a principal surface, said semiconductor substrate including (a) a first and a second diffusion regions of a second conductive type formed on the principal surface of said semiconductor substrate, and (b) a channel region of the lateral transistor formed on the principal surface of said semiconductor substrate and located between the first and second diffusion regions;

a first thin insulation film formed on the channel region of the lateral transistor;

a gate electrode formed on the thin insulating layer, said gate electrode having a side surface which is substantially perpendicular to the principal surface of said semiconductor substrate, the side surface of said gate electrode being exposed by a contact hole which exposes the second diffusion layer;

a second thin insulation layer formed on the side surface of said gate electrode in the contact hole;

a first doped semiconductor layer of the first conductive type formed in the contact hole so that the first doped semiconductor layer contacts said second diffusion region and said second thin insulation film, said first doped semiconductor layer serving as the connector;

a second doped semiconductor layer of the second conductive type formed on said first doped semiconductor layer, said semiconductor layer serving as a lower electrode of the capacitor;

a third thin insulation film formed on said semiconductor electrode; and a conductive layer formed on said third thin insulation film;

wherein said second diffusion layer, said first doped semiconductor layer, said second thin insulation layer, said gate electrode and said second doped semiconductor layer function as a vertical transistor which is connected between the lateral transistor and the capacitor.

* * * * *